(12) United States Patent
Nozawa et al.

(10) Patent No.: US 7,282,121 B2
(45) Date of Patent: *Oct. 16, 2007

(54) MANUFACTURING METHOD AND APPARATUS OF PHASE SHIFT MASK BLANK

(75) Inventors: Osamu Nozawa, Fuchu (JP); Hideaki Mitsui, Fuchu (JP)

(73) Assignee: Hoya Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/821,508

(22) Filed: Apr. 9, 2004

(65) Prior Publication Data

US 2004/0191651 A1    Sep. 30, 2004

Related U.S. Application Data

(62) Division of application No. 09/952,445, filed on Sep. 12, 2001, now Pat. No. 6,783,634.

(30) Foreign Application Priority Data

Sep. 12, 2000    (JP) ............... 2000-277354

(51) Int. Cl.
   *C23C 14/34*    (2006.01)
(52) U.S. Cl. ............... 204/192.12; 204/192.23; 204/192.26; 430/5
(58) Field of Classification Search ......... 204/192.1, 204/192.12, 192.23, 298.28, 192.26; 430/5
   See application file for complete search history.

(56) References Cited

U.S. PATENT DOCUMENTS

| | | | |
|---|---|---|---|
| 4,096,026 A | | 6/1978 | Takeuchi |
| 4,388,034 A | | 6/1983 | Takahashi |
| 5,626,727 A | * | 5/1997 | Yamanishi et al. .... 204/192.12 |
| 5,714,285 A | * | 2/1998 | Tu et al. .......... 430/5 |
| 5,798,027 A | | 8/1998 | Lefebvre et al. |
| 5,897,977 A | | 4/1999 | Carcia et al. .......... 430/5 |
| 5,934,856 A | | 8/1999 | Asakawa et al. |

(Continued)

FOREIGN PATENT DOCUMENTS

JP    2000-303172    * 10/2000

(Continued)

OTHER PUBLICATIONS

Machine Translation of 2000-303172.*

*Primary Examiner*—Rodney G. McDonald
(74) *Attorney, Agent, or Firm*—Cook, Alex, McFarron, Manzo, Cummings & Mehler, Ltd.

(57) ABSTRACT

There is disclosed a manufacturing method of a phase shift mask blank in which dispersions of phase angle and transmittance among blanks can be reduced as much as possible and yield is satisfactory. In the manufacturing method of the phase shift mask blank, a process of using a sputtering method to continuously form a thin film on a transparent substrate comprises: successively subjecting a plurality of substrates to a series of process of supplying the transparent substrate into a sputtering chamber, forming the thin film for forming a pattern in the sputtering chamber, and discharging the transparent substrate with the film formed thereon from the sputtering chamber; supplying and discharging the transparent substrate substantially at a constant interval; and setting a film formation time to be constant among a plurality of blanks.

14 Claims, 6 Drawing Sheets

U.S. PATENT DOCUMENTS

| | | |
|---|---|---|
| 5,955,223 A | 9/1999 | Mitsui et al. .................. 430/5 |
| 6,086,728 A | 7/2000 | Schwartz et al. ...... 204/192.12 |
| 6,286,452 B1 | 9/2001 | Namiki et al. |
| 6,419,802 B1 | 7/2002 | Baldwin et al. ....... 204/192.13 |
| 6,475,354 B1 | 11/2002 | Toyama |
| 6,669,987 B1 | 12/2003 | Schaefer et al. |
| 2002/0017910 A1 | 2/2002 | Sakai .......................... 324/750 |
| 2002/0106830 A1 | 8/2002 | Ohmi et al. .................. 438/69 |
| 2002/0197509 A1 | 12/2002 | Carcia et al. ............... 428/689 |

FOREIGN PATENT DOCUMENTS

| | | |
|---|---|---|
| WO | WO 00/63460 | 10/2000 |

* cited by examiner

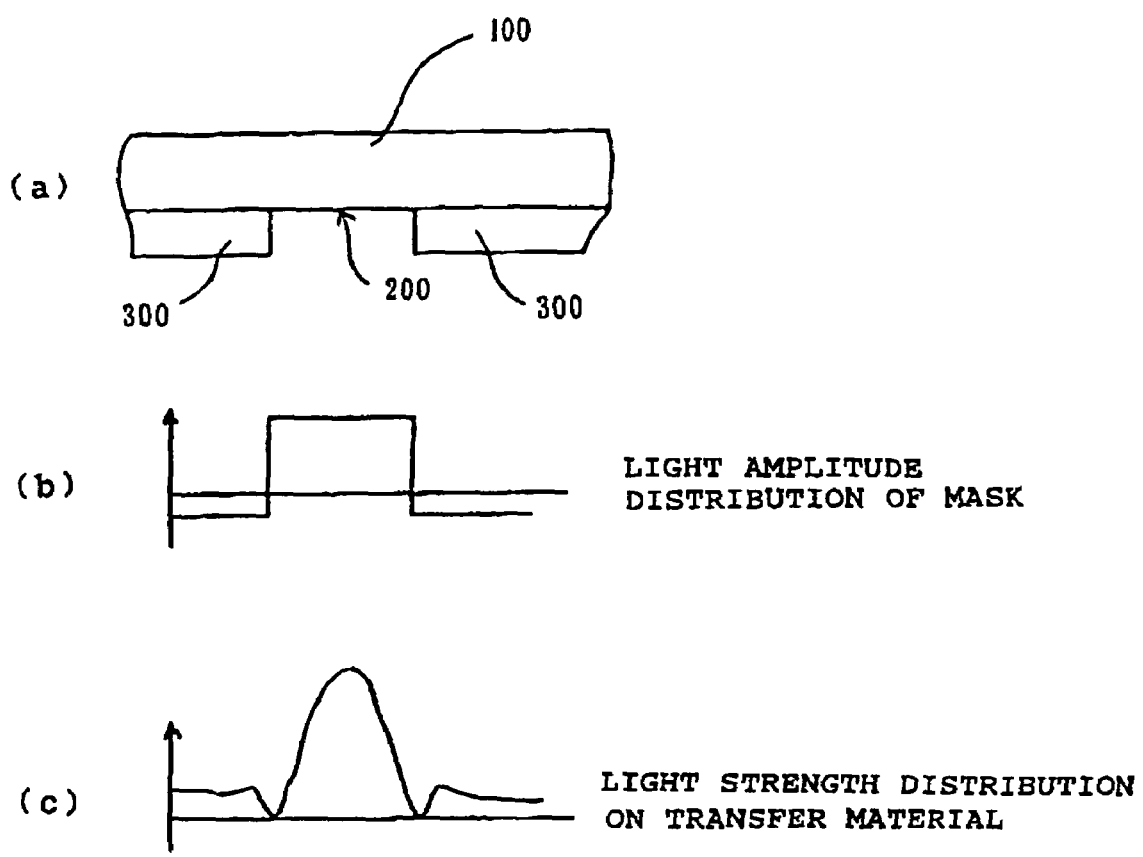

MANUFACTURING METHOD AND APPARATUS OF PHASE SHIFT MASK BLANK

This application is a divisional application of U.S. patent application Ser. No. 09/952,445 filed Sep. 12, 2001, now U.S. Pat. No. 6,783,634.

This application claims the Paris convention priority of Japanese patent application 2000-277354 filed on Sep. 12, 2000, the entire disclosure of which is incorporated herein by reference.

BACKGROUND OF THE INVENTION i) Field of the Invention

The present invention relates to a manufacturing method and apparatus of a phase shift mask blank which is suitable particularly for ArF or $F_2$ excimer laser.

ii) Description of the Related Art

In recent years, it has been clarified that high resolution and focus depth are two important properties required for photolithography but are in a contradictory relation with each other, and that a practical resolution cannot be enhanced only by high NA and short wavelength of a lens of an exposure apparatus (Monthly Semiconductor World 1990.12, Applied Physics Vol. 60, November, 1991, and the like).

Under such situation, phase shift lithography has been noted as the next-generation photolithography technique, and partially brought to practical use. The phase shift lithography is a method for enhancing the resolution of photolithography by change only of a mask without changing an optical system. When a phase difference is applied between exposure lights transmitted through the photo mask, mutual interference of the transmitted lights can be utilized to rapidly enhance the resolution.

The phase shift mask is a mask for using light strength information together with phase information. Various types of the masks are known such as Levenson type, auxiliary pattern type, and self-matching type (edge emphasizing type). These phase shift masks have a complicated constitution and requires a high degree of manufacturing technique as compared with the conventional photo mask which has only the light strength information.

In recent years, a so-called halftone type phase shift mask has been developed as one of the phase shift masks.

In the halftone phase shift mask, a light semi-transmission section has two functions: a shield function of substantially shielding the exposure light; and a phase shift function of shifting (usually reversing) a light phase. Therefore, it is unnecessary to separately form a shield film pattern and phase shift film pattern. This type of phase shift mask is simple in constitution and easy in manufacturing.

In the halftone phase shift mask, a mask pattern is processed by a dry etching process. However, in a method of realizing the shield function and phase shift function by separate layers, a high degree of control is necessary for both the layer having the shield function and the layer having the phase shift function in order to obtain a satisfactory pattern shape. On the other hand, when a single-layer light semi-transmission portion having both the shield function and the phase shift function is constituted, a single etching process can be used. Therefore, a manufacturing process of the mask can be simplified, and a satisfactory pattern shape can easily be obtained.

For the halftone phase shift mask, as shown in FIG. 10, a mask pattern formed on a transparent substrate 100 is constituted of a light transmission portion (transparent substrate exposed portion) 200 for transmitting a light which is strong enough to substantially contribute to exposure, and a light semi-transmission portion (shield and phase shifter portion) 300 for transmitting a light which is not strong enough to substantially contribute to the exposure (FIG. 10A). Additionally, the phase of the light transmitted to the light semi-transmission portion is shifted, and the light semi-transmission portion is brought to a substantially reversed relation with respect to the phase of the light transmitted through the light transmission portion (FIG. 10B). The lights transmitted in the vicinity of a boundary between the light semi-transmission portion and the light transmission portion and turned to the opposite portions by diffraction phenomenon cancel each other. Thereby, light strength in the boundary is substantially set to zero, and contrast, that is, resolution of the boundary is enhanced (FIG. 10C).

Additionally, the light semi-transmission portion or film (phase shift layer) in the halftone phase shift mask or blank needs to indicate a required optimum value with respect to both transmittance and phase shift amount. Concretely, (1) the transmittance in exposure wavelength of i-ray, KrF excimer laser, ArF excimer laser, or the like can be adjusted in a range of 3 to 20%, (2) a phase angle can be adjusted usually to a value in the vicinity of 180° in the exposure wavelength, and (3) the transmittance needs to be usually testable in a range of 65% or less in test wavelengths such as 257 nm, 266 nm, 364 nm, and 488 nm.

However, with shortening of the wavelength of laser for use in exposure to ArF excimer laser (193 nm) from i-ray (365 nm) and KrF excimer laser (248 nm), the following problem is generated in the conventional halftone phase shift mask and the manufacturing method of the mask.

That is, in mass production of the phase shift mask blanks, when there are dispersions of the phase angle and transmittance among the blanks or in the plane, yield is bad. Particularly in the mask blanks for the short wavelength of ArF or $F_2$ excimer laser, the dispersions of the phase angle and transmittance among the blanks and in the plane in the conventional mask blanks for i-ray and KrF excimer laser are large, and the yield is bad. Therefore, the mask blanks cannot be applied as they are.

SUMMARY OF THE INVENTION

The present invention has been developed under the aforementioned background, and a first object thereof is to provide a manufacturing method of a phase shift mask blank in which dispersions of a phase angle and transmittance among blanks can be reduced as much as possible and a yield is satisfactory.

Moreover, a second object is to provide a manufacturing method of the phase shift mask blank in which the dispersions of the phase angle and transmittance in a plane of the blanks can be reduced as much as possible and the yield is satisfactory.

Furthermore, a third object is to provide a manufacturing apparatus of the phase shift mask blank in which the dispersions of the phase angle and transmittance among the blanks can be reduced as much as possible and which can be manufactured with a satisfactory yield.

Additionally, a fourth object is to provide a manufacturing apparatus of the phase shift mask blank in which the dispersions of the phase angle and transmittance in the plane of the blanks can be reduced as much as possible and which can be manufactured with the satisfactory yield.

To achieve the aforementioned objects, the present invention has the following constitutions.

(Constitution 1) A method of continuously manufacturing a plurality of phase shift mask blanks each having at least a phase shift film on a transparent substrate, the method comprising a step of:

using a sputtering method to continuously form the phase shift film on the transparent substrate, wherein a dispersion of a phase angle of the phase shift film among the plurality of blanks is within ±2°:

(Constitution 2) A method of continuously manufacturing a plurality of halftone phase shift mask blanks each having at least a light semi-transmission film on a transparent substrate, the method comprising a step of:

using a sputtering method to continuously form the light semi-transmission film on the transparent substrate, wherein dispersions of a phase angle and a transmittance of the light semi-transmission film among the plurality of halftone phase shift mask blanks are within ±2° and within ±4%, respectively.

(Constitution 3) A method of continuously manufacturing a plurality of photo mask blanks each having at least a thin film for forming a pattern on a transparent substrate, the method comprising a step of:

using a sputtering method to continuously form the thin film on the transparent substrate, wherein the step of using the sputtering method to continuously form the thin film on the transparent substrate comprises steps of: successively subjecting a plurality of substrates to a series of processes of supplying the transparent substrate into a sputtering chamber, forming the thin film for forming the pattern in the sputtering chamber, and discharging the transparent substrate with the film formed thereon from the sputtering chamber; and supplying and discharging the transparent substrate substantially at a constant interval in order to set a film formation time to be constant among the plurality of blanks, and at least first to fifth photo mask blanks after start of film formation are excluded from the photo mask blanks obtained in the step.

(Constitution 4) The manufacturing method according to constitution 3 wherein the thin film for forming the pattern is a phase shift film, and the photo mask blank is a phase shift mask blank.

(Constitution 5) The manufacturing method according to constitution 3 wherein the thin film for forming the pattern is a light semi-transmission phase shift film, and the photo mask blank is a halftone phase shift mask blank.

(Constitution 6) A manufacturing method of a photo mask blank having a thin film for forming at least a pattern on a transparent substrate, the method comprising steps of:

rotating the substrate; sputtering a target disposed opposite to a position whose center axis deviates from a center axis of the substrate; and forming the thin film.

(Constitution 7) The manufacturing method according to constitution 6 wherein the target and the substrate are disposed so that opposite surfaces of the substrate and target form a predetermined angle therebetween.

(Constitution 8) The manufacturing method according to constitution 6 or 7 wherein the step of forming the film comprises a step of rotating the transparent substrate integer times between start of film formation and end of the film formation.

(Constitution 9) The manufacturing method according to any one of constitutions 6 to 8 wherein the thin film for forming the pattern is a phase shift film, and the photo mask blank is a phase shift mask blank.

(Constitution 10) The manufacturing method according to constitution 9 wherein a dispersion of a phase angle of the phase shift film in a plane is within ±2°.

(Constitution 11) The manufacturing method according to any one of constitutions 6 to 10 wherein the thin film for forming the pattern is a light semi-transmission phase shift film, and the photo mask blank is a halftone phase shift mask blank.

(Constitution 12) The manufacturing method according to constitution 11 wherein a dispersion of a phase angle of the light semi-transmission phase shift film in a plane is within ±2° and a dispersion of a transmittance in the plane is within ±4%.

(Constitution 13) The manufacturing method according to constitution 11 or 12 wherein the light semi-transmission phase shift film is formed by sputtering the target formed of a metal and silicon in an atmosphere containing nitrogen, contains the metal, silicon and nitrogen as main constituting components, and is formed so that a content of nitrogen in the light semi-transmission phase shift film is larger than a content of silicon.

(Constitution 14) A photo mask manufactured by patterning the thin film in the photo mask blank according to any one of constitutions 1 to 13.

(Constitution 15) A pattern transfer method of using the photo mask according to constitution 14 to transfer a pattern.

(Constitution 16) A manufacturing apparatus of a photo mask blank, comprising at least: a load lock mechanism for introducing substrates one by one; a substrate conveying mechanism for introducing the substrates one by one to a sputtering chamber from a load lock chamber at a constant interval; the sputtering chamber for forming a film on the substrate; and an unload lock mechanism for discharging the substrates one by one from the sputtering chamber.

(Constitution 17) A manufacturing apparatus of a photo mask blank, comprising: a substrate laying base having a rotation mechanism; and a target disposed opposite to a position whose center axis deviates from a center axis of a substrate.

(Constitution 18) The manufacturing apparatus according to constitution 17 wherein the target and the substrate are disposed so that opposite surfaces of the substrate and target form a predetermined angle therebetween.

(Constitution 19) The manufacturing apparatus of the halftone phase shift mask blank according to any one of constitutions 16 to 18, comprising: means for detecting a rotation position of the substrate; and means for turning OFF electric discharge (ending film formation) when the substrate rotated integer times after turning ON the electric discharge (starting the film formation) is allowed to reach the same rotation angle position as a rotation angle position for turning ON the electric discharge.

According to the constitutions 1 and 2, the dispersion of the phase angle of the phase shift film among the phase shift mask blanks is within ±2°, or the dispersions of the phase angle and transmittance of the light semi-transmission film among the halftone phase shift mask blanks are within ±2° and within ±4%, respectively. Therefore, the phase shift mask for a short wavelength of ArF or $F_2$ excimer laser can be manufactured in a mass and can practically be used. When this range is exceeded, it is difficult to mass-manufacture and practically use the phase shift mask for the short wavelength of ArF or $F_2$ excimer laser.

Additionally, even in the present situation, the masks for KrF excimer laser can practically be used. However, smaller dispersions of the phase angle and transmittance of the light semi-transmission film among the mask blanks are preferable. Therefore, the invention according to the constitutions 1 and 2 can also be applied to the phase shift mask blank for the KrF excimer laser.

According to the constitutions 3 to 5, the dispersions of film properties (transmittance (OD), film thickness, and the like) in the photo mask blank among the blanks can be suppressed. It is particularly possible to realize the manufacturing of the phase shift mask in which the dispersion of the phase angle of the phase shift film among the phase shift mask blanks is within ±2°, or the dispersions of the phase angle and transmittance of the light semi-transmission film among the halftone phase shift mask blanks are within ±2° and within ±4%, respectively.

According to the constitutions 6 to 12, the dispersions of the film properties (transmittance (OD), film thickness, and the like) in the plane in the photo mask blank can be suppressed. It is particularly possible to realize the phase shift mask blank in which the dispersion of the phase angle of the phase shift film in the plane of the phase shift mask blank is within ±2°, or the dispersions of the phase angle and transmittance of the light semi-transmission film in the plane of the halftone phase shift mask blank are within ±2° and within ±4%, respectively. Therefore, the phase shift mask for the short wavelength of the ArF or $F_2$ excimer laser can be brought to practical use. When this range is exceeded, it is difficult to practically use the phase shift mask for the short wavelength of the ArF or $F_2$ excimer laser.

Additionally, even in the present situation, the mask for the KrF excimer laser can practically be used. However, smaller dispersions of the phase angle and transmittance of the light semi-transmission film in the plane of the mask blank are preferable. Therefore, the invention according to the constitutions 6 and 12 can also be applied to the phase shift mask blank for the KrF excimer laser.

According to the constitution 13, the dispersion of the phase angle can further be suppressed.

According to the constitution 14, it is possible to obtain the photo mask in which the dispersion among the masks or in the mask plane is suppressed.

According to the constitution 15, a superior fine pattern processing can be realized.

According to the apparatus of the constitutions 16 to 19, the dispersions of the film properties (transmittance (OD), film thickness, and the like) in the photo mask blank among the blanks or in the plane can be suppressed. It is particularly possible to realize the manufacturing of the phase shift mask blank in which the dispersion of the phase angle of the phase shift film among the phase shift mask blanks or in the plane is within ±2°, or the dispersions of the phase angle and transmittance of the light semi-transmission film among the halftone phase shift mask blanks or in the plane are within ±2° and within ±4%, respectively.

The present invention will be described hereinafter in more detail.

As a result of pursuing of researches in order to achieve the aforementioned objects, the following has been obtained.

In the halftone phase shift mask, it is functionally important to adjust the phase angle and transmittance of the light semi-transmission portion and obtain desired values. For an error range of the phase angle and transmittance, fluctuation among blanks (dispersion among blanks), and in-blank distribution (in-plane dispersion) require to be about ±2°, and ±4°, respectively. Examples of a factor which changes the phase angle and transmittance include: (1) film formation procedure of the light semi-transmission film; (2) property of a sputtering apparatus for forming the light semi-transmission film, and (3) material of the light semi-transmission film.

(1) The film formation procedure for forming the light semi-transmission film will be described in detail.

To determine a film formation time of the light semi-transmission film at the start and end of sputtering, when an interval between the sputtering end and the next sputtering start is set to be constant, the fluctuations of the phase angle and transmittance among blanks (dispersion among blanks) are effectively within ±2°, and within ±4° reproducibility is effectively enhanced). In sputtering phenomenon, temperature and surface state of a target or a shield are changed, and a degree of vacuum in a vacuum tank is also changed. In a conventional intermittent sputtering in which the interval between the sputtering end and the next sputtering start is not constant, the state of the target or the shield changes every moment. However, in the present invention, when the interval between the sputtering end and the next sputtering start, and sputtering time and condition are always set to be constant, the fluctuations of the phase angle and transmittance are reduced on and after forming five to ten blanks. That is, when the light semi-transmission film is continuously formed at a constant interval, and fifth to tenth blanks formed after the start are excluded, it is possible to steadily manufacture the halftone phase shift mask blanks having less fluctuations of the phase angle and transmittance. Concretely, it is possible to steadily manufacture the halftone phase shift mask blanks in which the dispersions of the phase angle and transmittance among the blanks are within ±2°, and within ±4°, respectively.

In order to realize this process, as shown in FIG. 1, a load lock mechanism needs to be disposed which can constantly hold a sputtering vacuum tank (sputtering chamber) in a high vacuum state. In this apparatus constitution, introduction of the substrate to the sputtering chamber from a load lock chamber is continuously performed at a constant interval. For this, the load lock mechanism for introducing the substrates one by one needs to be disposed. Additionally, a capacity of the load lock chamber needs to be designed such that the substrate is continuously introduced to the sputtering chamber from the load lock chamber at the constant interval.

In the conventional manufacturing apparatus of the halftone phase shift mask blanks, about ten substrates are set in the load lock chamber from a viewpoint of throughput. In this system (or an in-line system), since the capacity of the load lock chamber is large, much time is required for setting the inside of the load lock chamber at a predetermined degree of vacuum, and film formation is not performed in the sputtering chamber during this time. Therefore, when the film formation all ends and the next cassette is set in the load lock chamber in order to perform the film formation, the substrate is not continuously supplied to the sputtering chamber at the constant interval. In this case, when the substrate is not continuously introduced to the sputtering chamber at the constant interval, the film formation in the sputtering chamber is not stabilized, the dispersions of the phase angle and transmittance among the blanks are large in the first five to ten blanks, and yield is disadvantageously bad.

In FIG. 1, a valve 12 for separating a load lock chamber 11 from the atmosphere, and a valve 14 for separating the load lock chamber 11 from a sputtering chamber 13 are attached to the load lock chamber 11. The load lock chamber 11 has a sheets system in which the substrate can continuously be introduced to the sputtering chamber at the constant interval as described above. The load lock chamber is also designed to have a predetermined capacity. The sputtering chamber 13 has a function equivalent to a function of the vacuum tank in which sputtering is performed as described later and shown in FIG. 2. When the substrate is introduced to the sputtering chamber 13 by a robot arm, a conveying chamber 15 may be disposed between the sputtering chamber 13 and the load lock chamber 11. For a robot arm 19, when an arm 19a opens/closes in a direction A, a hand 19b can move in a direction B. Moreover, the robot arm 19 can rotate in a direction C. The robot arm 19 is also constituted to be movable in a vertical direction with respect to a sheet surface. Furthermore, in order to enhance throughput of film formation, an unload lock chamber 16 having a constitution similar to that of the load lock chamber 11 may be added. An example of the process for forming the light semi-transmission film on the transparent substrate will be described with reference to FIG. 1.

1) After the valve 14 is closed, the inside of the load lock chamber 11 is set to be in an atmospheric pressure through venting.

2) The valve 12 is opened and one transparent substrate is introduced into the load lock chamber 11.

3) The valve 12 is closed and the load lock chamber 11 is evacuated.

4) After the load lock chamber 11 reaches a predetermined degree of vacuum, the valve 14 is opened and the transparent substrate is moved to the sputtering chamber 13.

5) A constitution described later and shown in FIG. 2 is used to form the light semi-transmission film in the sputtering chamber 13.

6) After the end of formation of the light semi-transmission film, a valve 17 is opened and the substrate is moved to the unload lock chamber 16. In this case, it is necessary to evacuate the unload lock chamber 16 to the predetermined degree of vacuum.

7) After the valve 17 is closed, the unload lock chamber is brought to the atmospheric pressure through venting.

8) A valve 18 is opened and the substrate is removed.

From when the light semi-transmission film is formed in the sputtering chamber 13, until the substrate is moved to the unload lock chamber 16 from the sputtering chamber 13, steps 1) to 4) are ended, and the next substrate is allowed to be on standby in the load lock chamber 11. When the previous film formation ends, and the substrate is moved to the unload lock chamber 16 from the sputtering chamber 13, the transparent substrate having been on standby is moved to the sputtering chamber 13, and the light semi-transmission film is successively formed. By this process, it is possible to successively (continuously) form the light semi-transmission film at the constant interval excluding a time of maintenance of the apparatus.

(2) The property of the sputtering apparatus for forming the light semi-transmission film will next be described in detail. Since a gas pressure during the sputtering for forming the light semi-transmission film, output of a sputtering DC power supply, and a sputtering time directly influence the transmittance and phase angle, precision of a gas flow rate controller, DC power supply or another apparatus needs to be enhanced. It is also necessary to enhance the precision of a set signal emitted from the controller. Since the gas pressure during the sputtering is also influenced by exhaust conductance of the apparatus, a mechanism able to accurately determine an open degree of an exhaust port valve and a position of the shield is also necessary. A concrete control precision will be described later.

Moreover, for a film containing silicon nitride, moisture generated from an inner wall of the vacuum tank, or another gas largely influences an optical property of the film. It is therefore necessary to dispose a pump which can sufficiently evacuate the vacuum tank, and a mechanism which can bake the inner wall of the vacuum tank. The degree of vacuum in the vacuum tank needs to be about $2\times10^{-5}$ pa or less at a film formation speed of 10 nm/min, and $1\times10^{-5}$ pa or less at a film formation speed of 5 nm/min.

Furthermore, in order to suppress the distributions of the phase angle and transmittance in the blanks (dispersions in the plane) within $\pm2°$ and $\pm4°$, the transparent substrate needs to be rotated during the film formation. It is further necessary to rotate the transparent substrate integer times between the start and the end of the film formation while the film formation is performed. To this end, for example, the rotation angle position of the substrate of a time at which electric discharge is turned ON (start of film formation) is detected by a sensor for detecting the rotation angle position of the substrate. Furthermore, by this sensor, when the substrate rotates integer times and reaches the same rotation angle position as that of the ON time of the electric discharge, the electric discharge is turned OFF (film formation is ended). This mechanism needs to be disposed.

The distributions of the phase angle and transmittance in the plane also change with a positional relation between the substrate and the target. The positional relation between the target and the substrate will be described with reference to FIG. 8.

An offset distance (distance between a center axis of the substrate and a straight line passed through a center of the target and extended in parallel to the center axis of the substrate) is adjusted by an area in which the distributions of the phase angle and transmittance are to be secured. Generally in a large area in which the distributions are to be secured, a necessary offset distance is large. In order to realize the phase angle distribution within $\pm2°$ and transmittance distribution within $\pm4°$ in a 152 mm square substrate as in the present embodiment, the offset distance needs to be in a range of about 200 mm to 350 mm, and a preferable offset distance is in a range of 240 mm to 280 mm.

An optimum range of a vertical distance between the target and the substrate (T/S) changes with the offset distance. However, in order to realize the phase angle distribution within $\pm2°$ and transmittance distribution within $\pm4°$ in the 152 mm square substrate, the vertical distance between the target and the substrate (T/S) needs to be about 200 mm to 380 mm, and preferable T/S is in a range of 210 mm to 300 mm.

A target inclination angle influences the film formation speed. In order to obtain a high film formation speed, the target inclination angle is appropriate in a range of 0° to 45°, and a preferable target inclination angle is in a range of 10° to 30°.

FIG. 9 shows upper and lower limits of T/S with which the phase angle distribution within $\pm2°$ and transmittance distribution within $\pm4°$ can be realized in the 152 mm square substrate with the change of the offset distance.

(3) The influence of the material of the light semi-transmission film on the phase angle and transmittance will next be described in detail. The phase angle and transmittance of the light semi-transmission film change with the film formation speed and degree of nitriding. The film formation speed and degree of nitriding are influenced by a nitrogen partial pressure during sputtering. However, when the light semi-transmission film is completely nitrided, the influence of the nitrogen partial pressure during sputtering is reduced. In a nitrided metal silicide film, a flow rate of nitrogen introduced during sputtering is adjusted so that a content of nitrogen measured by ESCA is larger than that of silicon. This can reduce the influence of a fluctuation of nitrogen partial pressure on the optical property. With this method, the distributions of the phase angle and transmittance in the plane can also be reduced. Additionally, when oxygen is added together with nitrogen during sputtering, the phase angle and transmittance are largely influenced by a fluctuation of a flow rate of oxygen. However, at least the influence of flow rate fluctuation of nitrogen can be reduced in the aforementioned method.

Additionally, examples of the photo mask blank in the constitution of the present invention include a shield film (chromium, a chromium compound containing oxygen, nitrogen, carbon, and the like in chromium, another chromium compound, and the like) in the photo mask, the phase shift film in the phase shift mask blank, and the like.

Moreover, the phase shift mask blank in the constitution of the present invention is not limited to the halftone phase shift mask blank. For a purpose of setting the dispersion of the phase angle within ±2°, the present invention can also be applied to the blank for manufacturing various types of the phase shift masks such as Levenson type, auxiliary pattern type, and self-matching type (edge emphasizing type).

BRIEF DESCRIPTION OF THE DRAWINGS

FIG. 10 is a schematic diagram showing a sputtering apparatus of the present invention.

DETAILED DESCRIPTION OF THE PREFERRED EMBODIMENTS

Examples of the present invention will be described hereinafter in further detail.

A DC magnetron sputtering apparatus described above with reference to FIG. 1 was used to continuously form films of 200 halftone phase shift mask blanks for ArF excimer laser (193 nm) one by one at constant intervals.

Concretely, a mixed target (Mo:Si=8:92 mol %) of molybdenum (Mo) and silicon (Si) was used to form a nitrided thin film (film thickness of about 670 angstroms) of molybdenum and silicon (MoSiN) on a transparent substrate by reactive sputtering (DC sputtering) in a mixed gas atmosphere (Ar: $N_2$=10%:90%, pressure: 0.1 Pa) of argon (Ar) and nitrogen ($N_2$). In this manner, the phase shift mask blank (film composition: Mo:Si:N=7:45:48) for ArF excimer laser (wavelength of 193 nm) was obtained.

Figure 1:
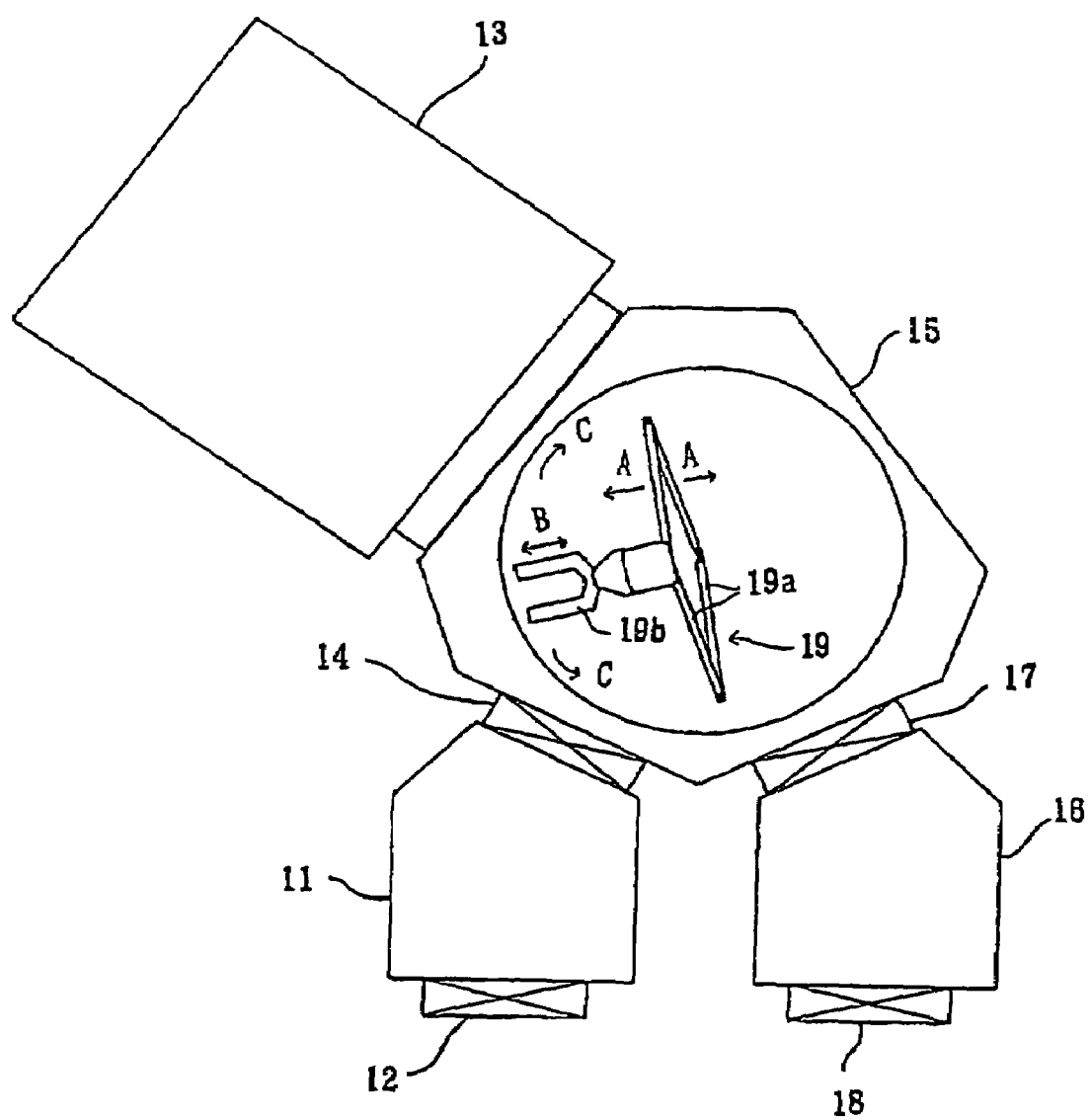
FIG. 1 is an explanatory view of transfer principle of a halftone phase shift mask.
Figure 2:
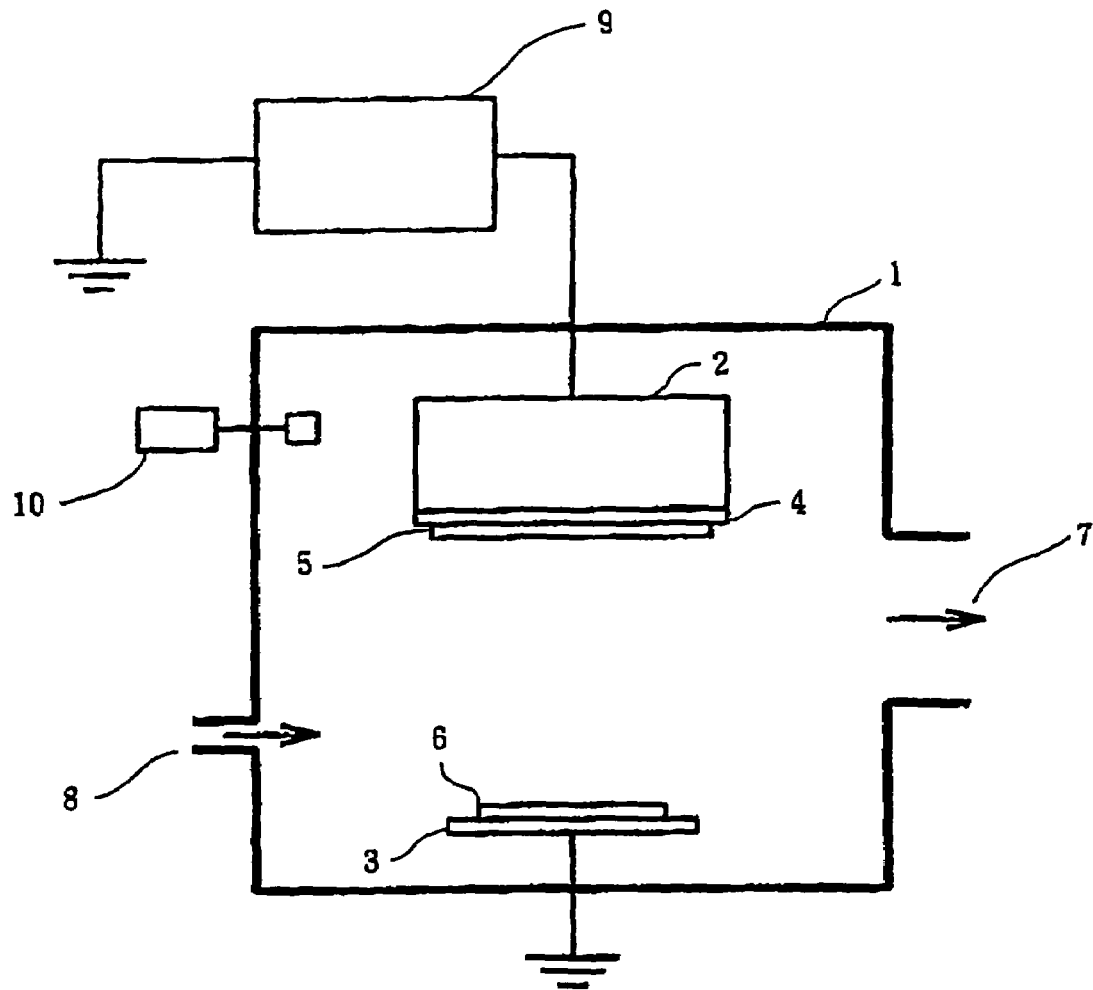
FIG. 2 is a schematic view of a sputtering chamber in a DC magnetron sputtering apparatus used in an embodiment.

Here, a sputtering chamber 13 in the DC magnetron sputtering apparatus shown in FIG. 1 has a vacuum tank 1 as shown in FIG. 2. A magnetron cathode 2 and substrate holder 3 are disposed in the vacuum tank 1. A sputtering target 5 bonded to a backing plate 4 is attached to the magnetron cathode 2. In the example, oxygen-free steel is used in the backing plate 4, and indium is used to bond the sputtering target 5 to the backing plate 4. The backing plate 4 is directly or indirectly cooled by a water cooling mechanism. The magnetron cathode 2, backing plate 4 and sputtering target 5 are electrically connected to one another. A transparent substrate 6 is attached to the substrate holder 3.

Figure 8:
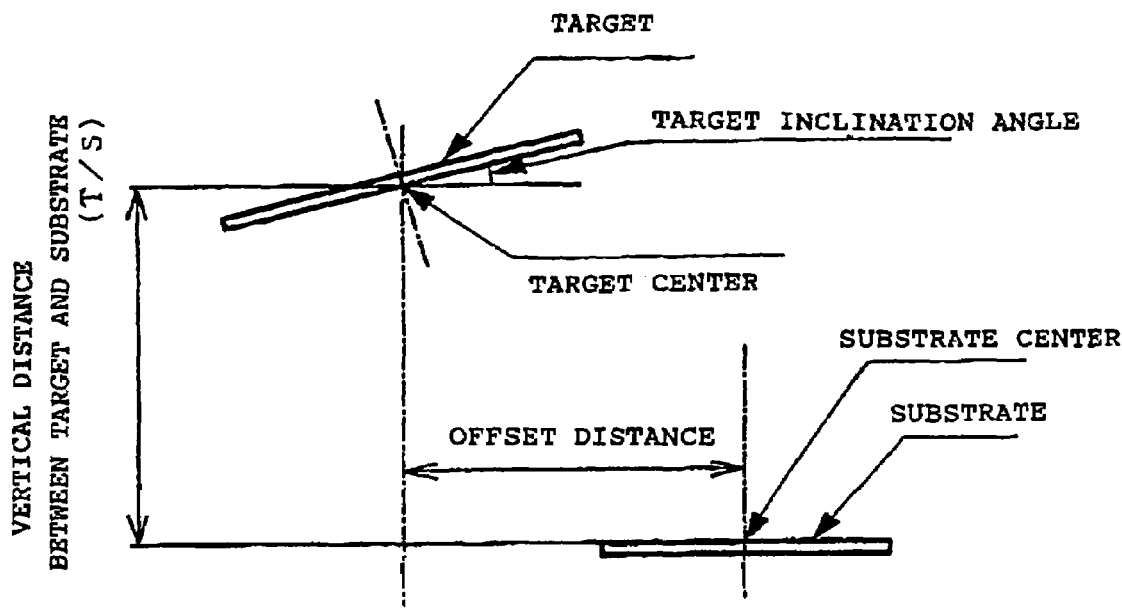
FIG. 8 is a schematic diagram showing a positional relation between a target and a substrate.
Figure 9:
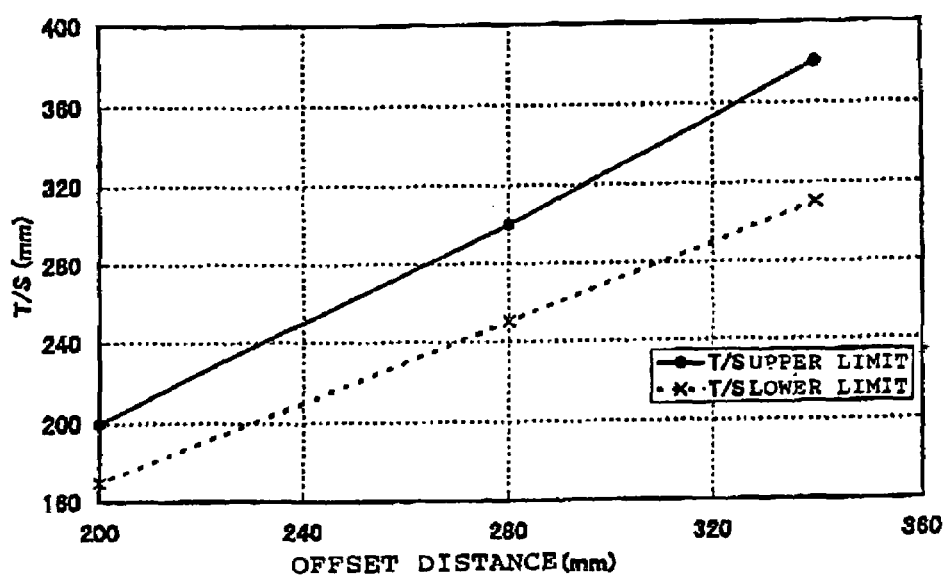
FIG. 9 is a graph showing upper and lower limits of T/S with which a phase angle distribution within ±2° and a transmittance distribution within ±4° can be realized with a change of an offset distance.

Additionally, in a constitution of the apparatus used in the present example, the sputtering target 5 and substrate 6 in FIG. 2 are arranged so that opposite surfaces of the substrate and target form a predetermined angle as shown in FIG. 8. In this case, an offset distance between the sputtering target and the substrate was set to 340 mm, a vertical distance between the target and the substrate (T/S) was 380 mm, and a target inclination angle was 15°.

The vacuum tank 1 is evacuated by a vacuum pump via an exhaust port 7. An atmosphere in the vacuum tank reaches a degree of vacuum which does not influence a property of the formed film, a mixed gas containing nitrogen is then introduced via a gas introduction port 8, a DC power supply 9 is used to apply a negative voltage to the magnetron cathode 2, and sputtering is performed. The DC power supply 9 has an arc detecting function, and can monitor an electric discharge state during sputtering. A pressure inside the vacuum tank 1 is measured by a pressure gauge 10.

A transmittance of a light semi-transmission film formed on the transparent substrate is adjusted by a type and mixture ratio of gases introduced via the gas introduction port 8. When the mixed gas contains argon and nitrogen, the transmittance is increased by increasing a ratio of nitrogen. When a desired transmittance cannot be obtained by adjusting the ratio of nitrogen, oxygen is added to the mixed gas containing nitrogen, and the transmittance can further be increased.

A phase angle of the light semi-transmission film was adjusted by a sputtering time, and the phase angle in an exposure wavelength was adjusted to about 180°.

Evaluation of Dispersion Among Blanks

Dispersions of the phase angle and transmittance among the blanks were checked with respect to 200 phase shift mask blanks (size: 15.2 cm square) obtained as described above. Results are shown in FIG. 3.

Figure 3:
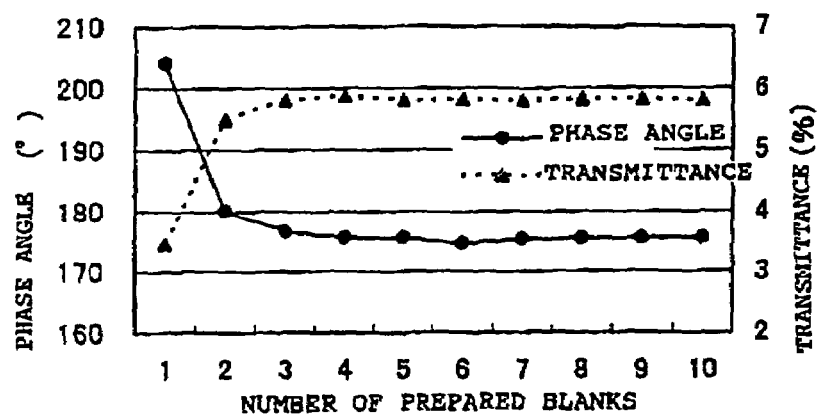
FIG. 3 is a graph showing dispersions of a phase angle and transmittance among blanks in the embodiment.

As seen from FIG. 3, on and after the third blank, the halftone phase shift mask blanks whose dispersions of the phase angle and transmittance among the blanks are within ±2° and within ±4°, respectively, can steadily be manufactured. Additionally, it was confirmed also with respect to the 11-th blank to 200-th blank that the dispersions of the phase angle and transmittance among the blanks were within ±2° and within ±4°, respectively. In this case, yield is 100% with respect to the phase angle and transmittance.

Additionally, in Example 2, 200 blanks were prepared similarly as the aforementioned Example 1 except that the sputtering chamber was opened for maintenance midway (at 190-th blank), and the dispersions of the phase angle and transmittance among the blanks were checked. Results are shown in FIG. 4.

Figure 4:
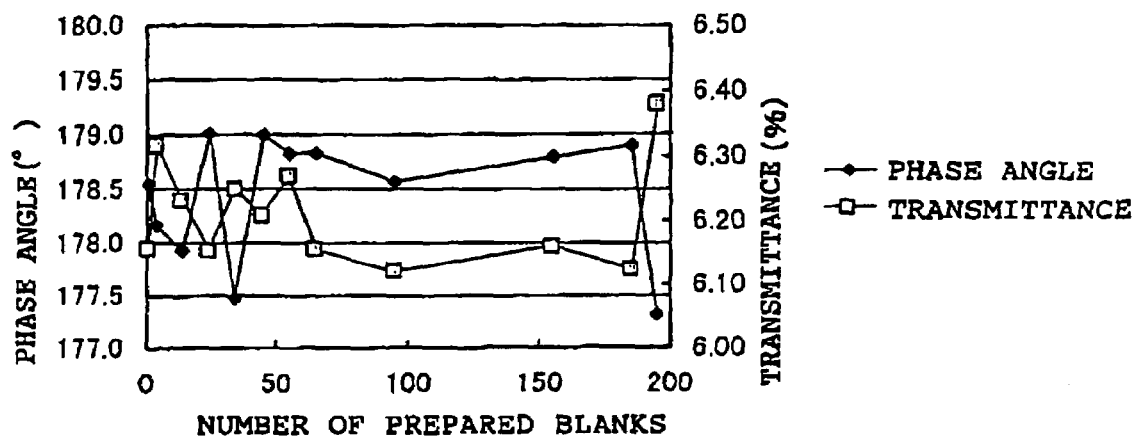
FIG. 4 is a graph showing dispersions of the phase angle and transmittance among the blanks in another embodiment.

As seen from FIG. 4, with use of the apparatus of the present invention, the halftone phase shift mask blanks whose dispersions of the phase angle and transmittance among the blanks are within ±2° and within ±4°, respectively, can steadily be manufactured excluding first several blanks and five blanks immediately after opening the sputtering chamber. It is also seen that the yield is 100% with respect to the phase angle and transmittance.

Moreover, a conventional manufacturing apparatus in which about ten substrates were disposed in a load lock chamber, and an in-line type manufacturing apparatus were used to manufacture the halftone phase shift mask blanks. However, in either apparatus, it was difficult to suppress the dispersions of the phase angle and transmittance among the blanks within ±2° and within ±4°, respectively, and the yield was bad.

Moreover, in Example 1, the transparent substrate was rotated during film formation. Furthermore, the transparent substrate was rotated integer times from the start till the end of the film formation, while the film formation was performed. The dispersions of the phase angle and transmittance in a plane were checked.

As a result, it was confirmed that the halftone phase shift mask blanks having the dispersions of the phase angle and transmittance in the plane within ±2° and ±4°, respectively, can steadily be manufactured.

Furthermore, the following was seen in the aforementioned examples.

Figure 5:
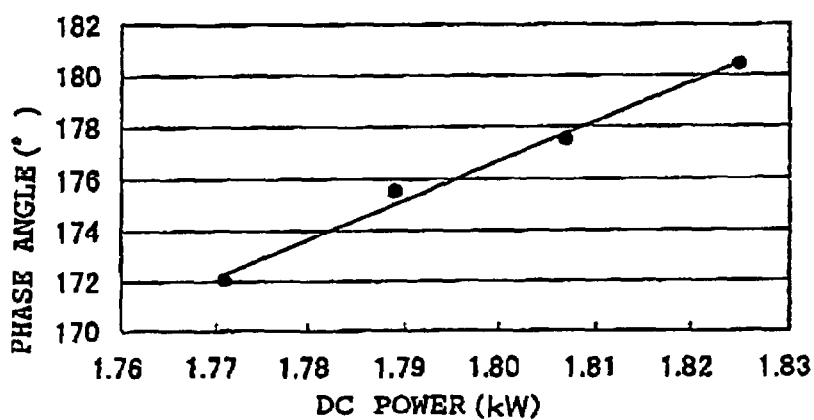
FIG. 5 is a graph showing a relation between DC power and phase angle.

As shown in FIG. 5, in order to suppress the dispersion of the phase angle in a range of about 180° to about 172°, it is necessary to control a power of the DC power supply in a range of about 1.77 kW to about 1.825 kW (preferably in a range of about 1.82 kW to 1.81 kW in order to suppress the dispersion of the phase angle in a range of about 180° to about 178°). Therefore, it is necessary to suppress a fluctuation of the power of the DC power supply at a center value ±0.5%.

Figure 6:
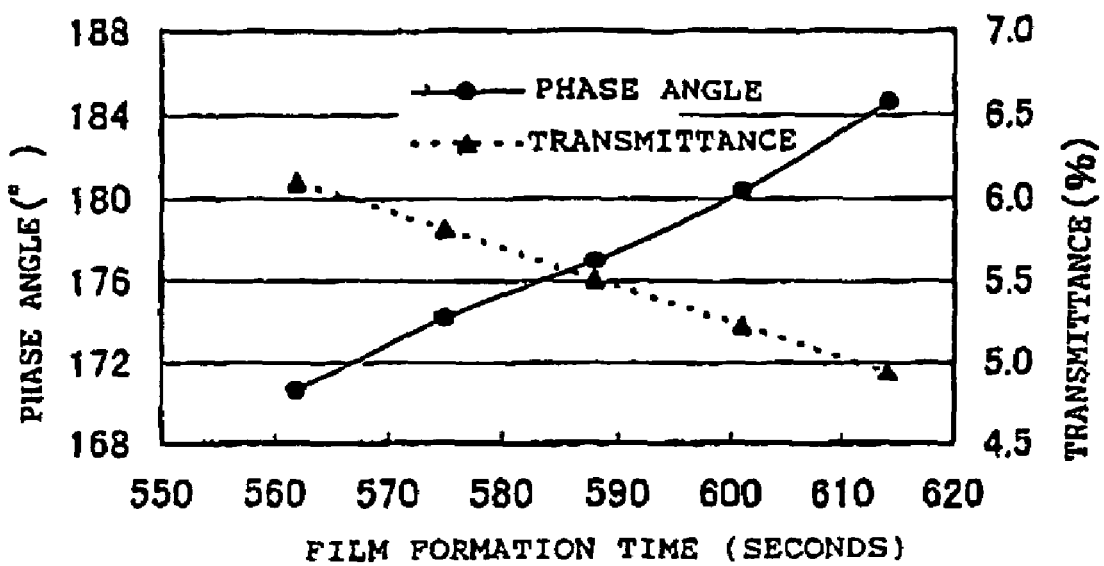
FIG. 6 is a graph showing a relation of a film formation time with the phase angle and transmittance.

Similarly, as seen from FIG. 6, in order to suppress the dispersions of the phase angle and transmittance, it is necessary to control the film formation time in a range of about 560 seconds to about 615 seconds (preferably about 600 seconds to about 594 seconds in order to suppress the dispersion of the phase angle in a range of about 180° to about 178°). Therefore, it is necessary to suppress a fluctuation of the film formation time at a center value ±0.5%.

Figure 7:
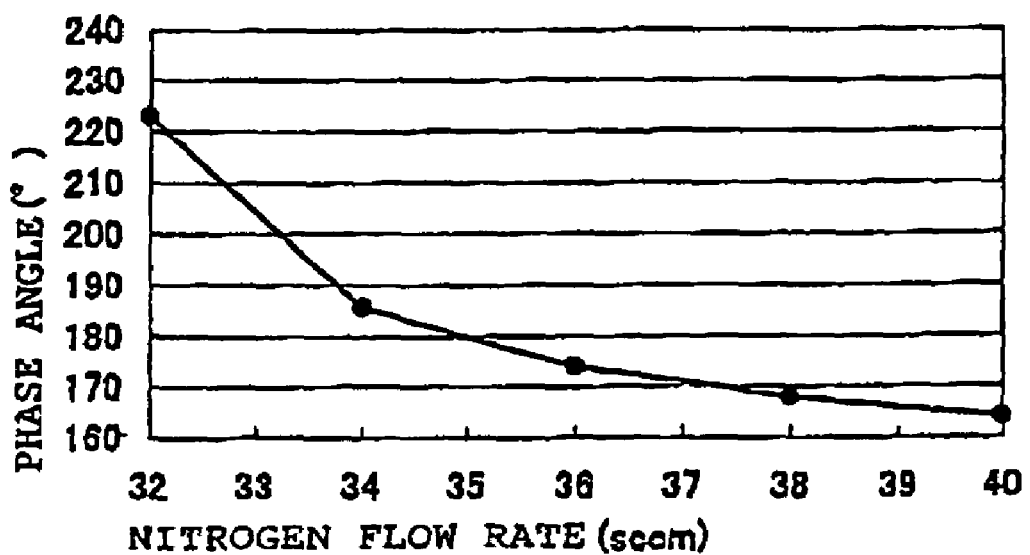
FIG. 7 is a graph showing a relation between a nitrogen flow rate and phase angle.

Similarly, as seen from FIG. 7, in order to suppress the dispersion of the phase angle, a flow rate of nitrogen introduced during sputtering is adjusted so that a content of nitrogen measured by ESCA in a nitrided metal silicide film is larger than a content of silicon, and an influence of a fluctuation of nitrogen partial pressure on an optical property is reduced. For this purpose, it is necessary to control the flow rate of nitrogen in a range of about 35 sccm or more (preferably about 35 sccm to about 35.5 sccm in order to suppress the dispersion of the phase angle in a range of about 180° to about 178°). Additionally, the nitrogen flow rate with which the influence of the fluctuation of nitrogen partial pressure on the optical property can be reduced changes with an exhaust property and DC power of the apparatus.

Evaluation of Dispersion in Plane

The dispersions of the phase angle and transmittance in a plane were checked with respect to one of the phase shift mask blanks obtained as described above.

As a result, the dispersion of the phase angle was within ±0.8° (average value of 179.5°, range of 178.8° to 180.3°) in a range of 132 mm square excluding a substrate peripheral portion of 10 mm. Moreover, the dispersion of the transmittance was within ±1.3% (average value of 6.16%, range of 6.08% to 6.23%).

Additionally, for comparison, when the film formation was performed at an offset distance of 340 mm, a vertical distance between the target and the substrate (T/S) of 400 mm, and a target inclination angle of 15°, the dispersion of the phase angle was ±3.5° (average value of 178.8°, range of 175.3° to 181.7°). Moreover, the dispersion of the transmittance was ±8% (average value of 6.07%, range of 5.83% to 6.56%).

Furthermore, for comparison, when the target was disposed opposite to the substrate (offset distance of 0 mm, and target inclination angle of 0°), the dispersion of the phase angle was ±2.7° (average value of 179.8°, range of 177.1° to 182.0°) in a target diameter of 16 inchesϕ. Moreover, the dispersion of the transmittance was ±4.2% (average value of 6.19%, range of 6.00% to 6.45%).

With a larger offset distance, it is easier to reduce the dispersion in the plane. However, when the offset distance is excessively large, a capacity of the vacuum tank increases, evacuation property is therefore deteriorated, and further a film formation speed is lowered.

Additionally, the dispersion in the plane was evaluated by judging whether or not both a maximum point (plus value) and minimum point (minus value) with respect to the average value (center value) were within a defined range.

The preferred examples of the present invention have been described above, but the present invention is not limited to the aforementioned examples.

For example, molybdenum was used as a metal constituting the light semi-transmission film, but this is not limited, and zirconium, titanium, vanadium, niobium, tantalum, tungsten, nickel, palladium, and the like can be used.

Moreover, the target of molybdenum and silicon was used as the target containing metal and silicon, but this is not limited. In the target containing metal and silicon, molybdenum is particularly superior among the aforementioned metals in controllability of the transmittance and in that a target density increases and particles in the film can be reduced with use of the sputtering target containing metal and silicon. Titanium, vanadium, and niobium are superior in resistance to an alkaline solution, but slightly inferior to molybdenum in the target density. Tantalum is superior in the resistance to the alkaline solution and target density, but slightly inferior to molybdenum in the controllability of transmittance. Tungsten has properties similar to those of molybdenum, but is slightly inferior to molybdenum in an electric discharge property during sputtering. Nickel and palladium are superior in the optical property and resistance to the alkaline solution, but dry etching is slightly difficult to perform. Zirconium is superior in the resistance to the alkaline solution, but inferior to molybdenum in the target density, and the dry etching is slightly difficult to perform. Considering these, molybdenum is most preferable at present. Molybdenum is also preferable for a nitrided molybdenum and silicon (MoSiN) thin film (light semi-transmission film) in superior chemicals resistance such as acid resistance and alkali resistance.

Moreover, in order to obtain the thin film of a composition in which electric discharge stability is secured during film formation and various properties of the phase shift mask are satisfied, the target containing 70 to 95 mol % of silicon, and metal is preferably subjected to DC magnetron sputtering in the atmosphere containing nitrogen. Thereby, the light semi-transmission film containing nitrogen, metal and silicon is preferably formed.

When the content of silicon in the target is larger than 95 mol %, a voltage is not easily applied (electricity is not easily passed) to a target surface (erosion portion) in the DC sputtering, and the electric discharge becomes unstable. Moreover, when the content of silicon is less than 70 mol %, the film constituting a light semi-transmission portion with a high transmittance cannot be obtained. Furthermore, electric discharge stability is further enhanced by combination of the nitrogen gas with the DC sputtering.

Additionally, the electric discharge stability during film formation also influences film quality. When the electric discharge stability is superior, the light semi-transmission film with a satisfactory film quality is obtained.

As described above, according to the present invention, there can be provided the manufacturing method of the phase shift mask blank in which the dispersions of phase angle and transmittance among blanks can be reduced as much as possible and the yield is satisfactory.

Moreover, there can be provided the manufacturing method of the phase shift mask blank in which the dispersions of phase angle and transmittance in the plane of the blanks can be reduced as much as possible and the yield is satisfactory.

Furthermore, there can be provided the manufacturing apparatus of the phase shift mask blank in which the dispersions of phase angle and transmittance among the blanks can be reduced as much as possible and which can be manufactured with the satisfactory yield.

Additionally, there can be provided the manufacturing apparatus of the phase shift mask blank in which the dispersions of phase angle and transmittance in the plane of the blanks can be reduced as much as possible and which can be manufactured with the satisfactory yield.

What is claimed is:

1. A manufacturing method of a photo mask blank having at least a thin film for forming a pattern on a transparent substrate, said method comprising the steps of:
    setting a substrate in a horizontal position where a surface of the substrate on which said thin film is formed and a surface of a sputtering target are in opposed position with a center axis of said target deviating from a center axis of said substrate surface, and
    sputtering the target while rotating said substrate around its center axis so as to form said thin film,
    wherein the forming of the thin film is controlled so as to make the rotation number during the film formation an integer.

2. The manufacturing method according to claim 1 wherein the target and the substrate are disposed so that opposite surfaces of said substrate and the target form a predetermined angle therebetween.

3. The manufacturing method according to claim 2 wherein said thin film for forming the pattern is a phase shift film, and said photo mask blank is a phase shift mask blank.

4. A manufacturing method of a photo mask blank of claim 1 wherein the controlling is carried out in a manner that a position of the substrate at the starting of film forming is detected by an sensor, and, when the same position is detected by the sensor after an integer times of rotation of the substrate, the film forming is stopped.

5. The manufacturing method according to claim 2 wherein the predetermined angle is 10 to 30 degree.

6. The manufacturing method according to claim 5 wherein said thin film for forming the pattern is a phase shift film, and said photo mask blank is a phase shift mask blank.

7. The manufacturing method according to claim 6 wherein a dispersion of a phase angle of said phase shift film in a plane is within ±2°.

8. The manufacturing method according to claim 5 wherein said thin film for forming the pattern is a light semi-transmission phase shift film, and said photo mask blank is a halftone phase shift mask blank.

9. The manufacturing method according to claim 8 wherein a dispersion of a phase angle of said light semi-transmission phase shift film in a plane is within ±2° and a dispersion of a transmittance in the plane is within ±4% of an average value.

10. The manufacturing method according to claim 8 wherein said light semi-transmission phase shift film is formed by sputtering the target formed of a metal and silicon in an atmosphere containing nitrogen, contains the metal, silicon and nitrogen as main constituting components, and is formed so that a content of nitrogen in said light semi-transmission phase shift film is larger than a content of silicon.

11. A manufacturing method of a photo mask blank having at least a thin film for forming a pattern on a transparent substrate, said method comprising the steps of:
    setting a substrate in a horizontal position where a surface of the substrate on which said thin film is formed and a surface of a sputtering target are in opposed position with a center axis of said target deviating from a center axis of said substrate surface, and
    sputtering the target while rotating said substrate around its center axis so as to form said thin film,
    wherein, when said substrate has a size of one side 152 mm of square, an offset distance is 200 to 350 mm, and T/S value is 200 to 380 mm,
    said offset distance being a distance between a center axis of the substrate and a straight line passing through a center of the target and extended in parallel to the center axis of the substrate, and T/S value being a vertical distance between the target and the substrate.

12. The manufacturing method of claim 11 wherein, when substrate has a size of one side 152 mm of square, said offset distance is 240 to 280 mm, and T/S value is 210 to 300 mm.

13. A method for pattern transferring comprising:
    preparing a photo mask blank having at least a thin film for forming a pattern on a transparent substrate,
    preparing a photo mask by forming the pattern on the thin film, and
    exposing a light to the photo mask,
    wherein the photo mask blank is prepared by a method comprising the steps of:
        setting a substrate in a horizontal position where a surface of the substrate on which said thin film is formed and a surface of a sputtering target are in opposed position with a center axis of said target deviating from a center axis of said substrate surface, and
        sputtering the target while rotating said substrate around its center axis so as to form said thin film,
    wherein the rotation of said substrate is controlled so as to make the rotation number during the film formation an integer by detecting a rotation angle from the start up to the end of the film formation.

14. The method for pattern transferring of claim 13 wherein the target and the substrate are disposed so that opposite surfaces of said substrate and the target form an angle of 10 to 30 degree.

* * * * *